(12) United States Patent
Ke

(10) Patent No.: US 8,927,394 B2
(45) Date of Patent: Jan. 6, 2015

(54) MANUFACTURING METHOD OF AN ACTIVE DEVICE SUBSTRATE

(71) Applicant: AU Optronics Corporation, Hsin-Chu (TW)

(72) Inventor: Tsung-Ying Ke, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 14/042,869

(22) Filed: Oct. 1, 2013

(65) Prior Publication Data

US 2014/0327006 A1    Nov. 6, 2014

(30) Foreign Application Priority Data

May 1, 2013    (TW) .............................. 102115623 A

(51) Int. Cl.
  H01L 21/46    (2006.01)
  H01L 21/78    (2006.01)
  H01L 21/301   (2006.01)
  H01L 29/04    (2006.01)
  H01L 29/12    (2006.01)
  H01L 33/02    (2010.01)

(52) U.S. Cl.
  CPC ................ H01L 21/78 (2013.01); H01L 29/04 (2013.01); H01L 29/12 (2013.01); H01L 33/02 (2013.01)
  USPC ............ 438/463; 438/462; 438/464; 257/49; 257/E21.599

(58) Field of Classification Search
  USPC ............ 438/462, 463, 464; 257/49, E21.599
  See application file for complete search history.

(56) References Cited

U.S. PATENT DOCUMENTS

| 8,715,802 B2 * | 5/2014 | Tsai et al. ................... 428/41.8 |
| 2011/0092006 A1 | 4/2011 | An et al. |
| 2012/0273040 A1 | 11/2012 | Kim et al. |
| 2013/0011969 A1 * | 1/2013 | Chen et al. .................. 438/111 |
| 2013/0071650 A1 * | 3/2013 | Liu et al. ..................... 428/333 |
| 2014/0065916 A1 * | 3/2014 | Lee et al. ...................... 445/25 |

FOREIGN PATENT DOCUMENTS

| CN | 100477079 | 4/2009 |
| CN | 102509719 | 6/2012 |
| CN | 102760791 | 10/2012 |
| CN | 102931255 | 2/2013 |
| JP | 2006-287068 | 10/2006 |

\* cited by examiner

*Primary Examiner* — Phuc Dang
(74) *Attorney, Agent, or Firm* — WPAT, PC; Justin King

(57) ABSTRACT

An active device substrate includes a flexible substrate, an inorganic de-bonding layer, and at least one active device. The flexible substrate has a first surface and a second surface opposite to the first surface, wherein the first surface is a flat surface. The inorganic de-bonding layer covers the first surface of the flexible substrate, and the material of the inorganic de-bonding layer is metal, metal oxide or combination thereof. The active device is disposed on or above the second surface of the flexible substrate.

6 Claims, 5 Drawing Sheets

MANUFACTURING METHOD OF AN ACTIVE DEVICE SUBSTRATE

RELATED APPLICATIONS

This application claims priority to Taiwan Application Serial Number 102115623, filed May 1, 2013, which is herein incorporated by reference.

BACKGROUND

1. Technical Field

The present disclosure relates to an active device substrate.

2. Description of Related Art

Recently, a new display with a flexible active device substrate has been lunched in the market. Because of its flexibility, the display device may replace the traditional papers or billboards.

In the manufacturing process of the flexible active device substrate, it is convenient to fix a flexible substrate on a glass plate and then dispose active devices on the flexible substrate to form the flexible active device substrate. Afterwards, the flexible active device substrate is separated from the glass plate. However, when the attractive forces between the flexible substrate and the glass plate is too large, it is difficult to completely separate the flexible substrate and the glass plate so that the active devices may be damaged. Therefore, many in the industry are striving to improve the peeling manufacture of the flexible active device substrate.

SUMMARY

An aspect of the present invention provides an active device substrate. The active device substrate includes a flexible substrate, an inorganic de-bonding layer, and at least one active device. The flexible substrate has a first surface and a second surface opposite to the first surface. The first surface is a flat surface. The inorganic de-bonding layer covers the first surface of the flexible substrate. The material of the inorganic de-bonding layer is metal, metal oxide or a combination thereof. The active device is disposed on or above the second surface of the flexible substrate.

In one or more embodiments, the material of the inorganic de-bonding layer is metal. A thickness of the inorganic de-bonding layer is about 0.001 to 1 μm. The material of the inorganic de-bonding layer is Au, Ag, Pt, Cu, Ti, Al, Cr, Pd, Rh, Mo, W, Zn, Sn, or a combination thereof.

In one or more embodiments, the material of the inorganic de-bonding layer is metal oxide. A thickness of the inorganic de-bonding layer is about 0.001 to 1 μm. The material of the inorganic de-bonding layer is $In_2O_3$, $SnO_2$, ZnO, CdO, TiN, $In_2O_3$:Sn (ITO), ZnO:In (IZO), ZnO:Ga (GZO), ZnO:Al (AZO), $SnO_2$:F, $TiO_2$:Ta, $CdIn_2O_4$, $Cd_2SnO_4$, $Zn_2SnO_4$, or a combination thereof.

In one or more embodiments, the material of the flexible substrate is polyimide (PI), polycarbonate (PC), polyethersulfone (PES), polynorbornene (PNB), polyetherimide (PEI), poly(p-phenylene benzobisimidazole) (PBI), poly(p-phenylene benzobisoxazole) (PBO), poly(p-phenylene terephthalamide)(PPTA), or a combination thereof. The inorganic de-bonding layer completely covers the first surface of the flexible substrate.

Another aspect of the present invention provides a manufacturing method of an active device substrate including the following steps of: (The steps are not recited in the sequence in which the steps are performed. That is, unless the sequence of the steps is expressly indicated, the sequence of the acts is interchangeable, and all or part of the steps may be simultaneously, partially simultaneously, or sequentially performed.)

A supporting plate is provided. An organic de-bonding layer is formed on the supporting plate. An inorganic de-bonding layer is formed on the organic de-bonding layer. The material of the inorganic de-bonding layer is metal, metal oxide, or a combination thereof. A flexible substrate is formed on the inorganic de-bonding layer. A surface of the flexible substrate adjacent to the inorganic de-bonding layer is a flat surface. At least one active device is formed on or above the flexible substrate.

In one or more embodiments, the manufacturing method further includes:

The flexible substrate and the inorganic de-bonding layer are cut to form a stack structure formed by the inorganic de-bonding layer, the flexible substrate, and the active device. The organic de-bonding layer and the inorganic de-bonding layer are separated.

In one or more embodiments, the manufacturing method further includes:

The organic de-bonding layer is cut.

In one or more embodiments, the step of forming the organic de-bonding layer is performed by physical vapor deposition (PVD), chemical vapor deposition (CVD), spin coating, spray coating, plasma modification, or printing. The material of the organic de-bonding layer is parylene, silane, siloxane, organofluorine, FAS (Fluoroalkylsilane), or a combination thereof. The step of forming the inorganic de-bonding layer is performed by PVD, CVD, or sputtering. The manufacturing method further includes:

The organic de-bonding layer is thermal annealed before forming the inorganic de-bonding layer.

Yet another aspect of the present invention provides a manufacturing method of a display device including the following steps:

The manufacturing method of an active device substrate mentioned above. At least one display element is formed on the at least one active device.

In one or more embodiments, the manufacturing method further includes:

The flexible substrate and the inorganic de-bonding layer are cut to separate the organic de-bonding layer and the inorganic de-bonding layer before or after the step of forming the at least one display element on the at least one active device.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
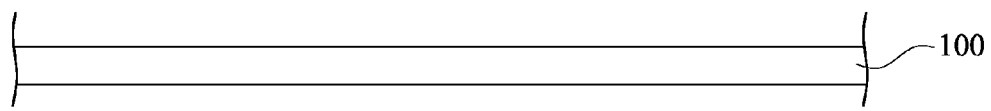
FIGS. 1 to 7 are cross-sectional views of a manufacturing method of an active device substrate according to one embodiment of the present invention.

FIGS. 1 to 7 are cross-sectional views of a manufacturing method of an active device substrate according to one embodiment of the present invention. Reference is made to FIG. 1. A manufacturer can provide a supporting plate 100 first. The supporting plate 100 in this embodiment can be a rigid substrate, such as a glass, a quartz, or a silicon substrate.

Figure 2:
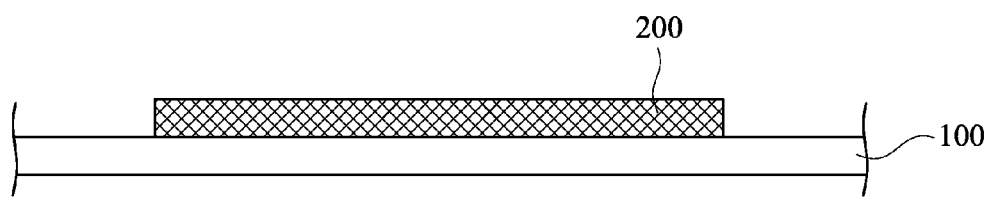

Reference is made to FIG. 2. The manufacturer can form an organic de-bonding layer 200 on the supporting plate 100. The organic de-bonding layer 200 can be selected to completely or partially cover the supporting plate 100, or the manufacturer can design the size of the organic de-bonding layer 200 according to the size of the active device substrate. Basically, an embodiment falls within the scope of the claimed invention if the active device substrate can be formed above the organic de-bonding layer 200. Moreover, the organic de-bonding layer 200 can be thermal annealed to remove impurities after it is formed on the supporting plate 100.

The material of the organic de-bonding layer 200 can be parylene, silane, siloxane, FAS, or a combination thereof. The organic de-bonding layer 200 can be formed by physical vapor deposition (PVD), chemical vapor deposition (CVD), spin coating, spray coating, plasma modification, or printing.

Figure 3:
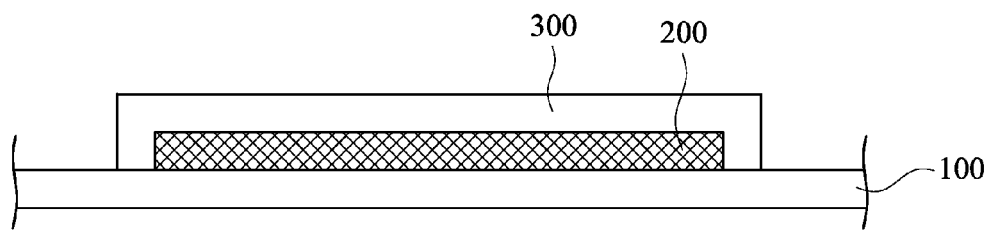

Reference is made to FIG. 3. Substantially, the manufacturer can form an inorganic de-bonding layer 300 on the organic de-bonding layer 200. For example, the inorganic de-bonding layer 300 can completely cover the organic de-bonding layer 200. However, the scope of the claimed invention should not be limited in this respect. In some embodiments, the inorganic de-bonding layer 300 can partially cover the organic de-bonding layer 200. Basically, an embodiment falls within the scope of the claimed invention if an active device can be formed above both of the inorganic de-bonding layer 300 and the organic de-bonding layer 200. The inorganic de-bonding layer 300 can be formed by PVD such as sputtering, or CVD.

Figure 4:
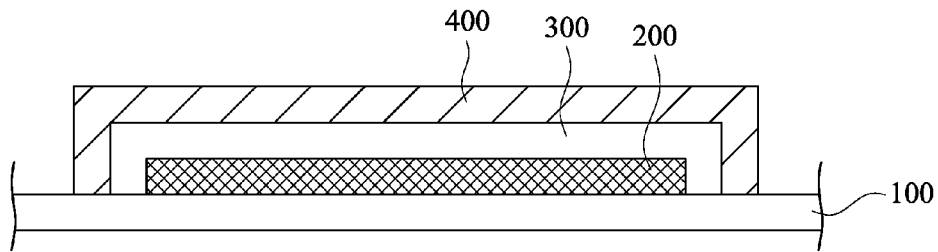

Reference is made to FIG. 4. Form a flexible material or a flexible substrate 400 on the inorganic de-bonding layer 300. The flexible substrate 400 can be formed on both of the organic de-bonding layer 200 and the inorganic de-bonding layer 300, such that the organic de-bonding layer 200 and the inorganic de-bonding layer 300 can be wrapped by the flexible substrate 400 and the supporting plate 100, as shown in FIG. 4. Alternatively, the flexible substrate 400 can be partially formed on the inorganic de-bonding layer 300. Basically, an embodiment falls within the scope of the claimed invention if the active device can be formed above the flexible substrate 400, the inorganic de-bonding layer 300, and the organic de-bonding layer 200.

The material of the flexible substrate 400 can be polyimide (PI), polycarbonate (PC), polyethersulfone (PES), polynorbornene (PNB), polyetherimide (PEI), poly(p-phenylene benzobisimidazole) (FBI), poly(p-phenylene benzobisoxazole) (PBO), poly(p-phenylene terephthalamide)(PPTA), or a combination thereof. The flexible substrate 400 can be formed by spin coating, slot-die coating, or lamination.

Figure 5:
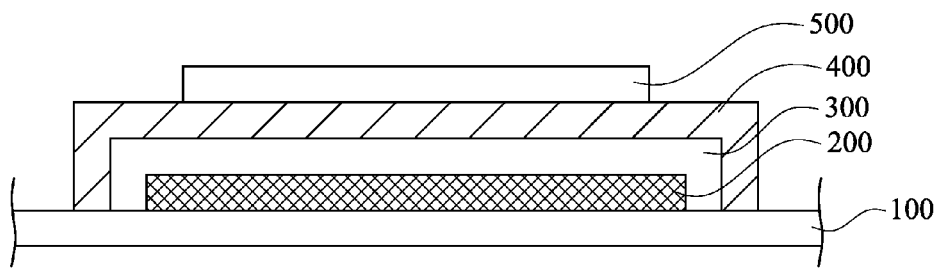

Reference is made to FIG. 5. Substantially, the manufacturer can form at least one active device, such as a thin-film transistor (TFT), on or above the flexible substrate 400. In one or more embodiments, there can be a plurality of the active devices to form an active device array 500 disposed on or above the flexible substrate 400 if the active device substrate is applied in a display device. Each active device of the active device array 500 can be a switch to control the corresponding pixel unit of the display device. After the manufacture of FIG. 5, the inorganic de-bonding layer 300, the flexible substrate 400, and the active device array 500 compose the active device substrate.

Figure 6:
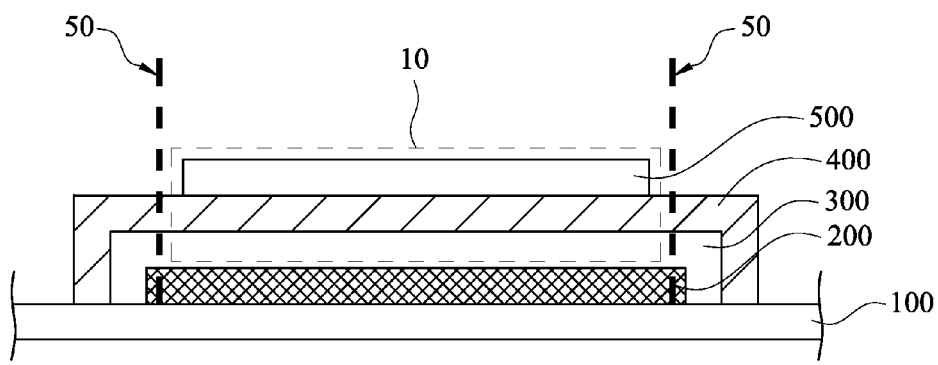

Reference is made to FIG. 6. The manufacturer can perform a cutting treatment along cutting lines 50 to define and align edges of the active device substrate. In greater detail, the manufacturer can cut at least the flexible substrate 400 and the inorganic de-bonding layer 300 along the cutting lines 50 to define a stack structure 10, i.e., the active device substrate, including the inorganic de-bonding layer 300, the flexible substrate 400, and the active device array 500. The cutting treatment can be laser cutting or mechanical cutting.

It should be noticed that although only the inorganic de-bonding layer 300 and the flexible substrate 400 are cut in this embodiment, the organic de-bonding layer 200 can also be cut in the cutting treatment for convenience in other embodiments. Moreover, the manufacturer can further cut the active device array 500 in the cutting treatment according to real requirements although the active device array 500 is not cut in FIG. 6.

Figure 7:
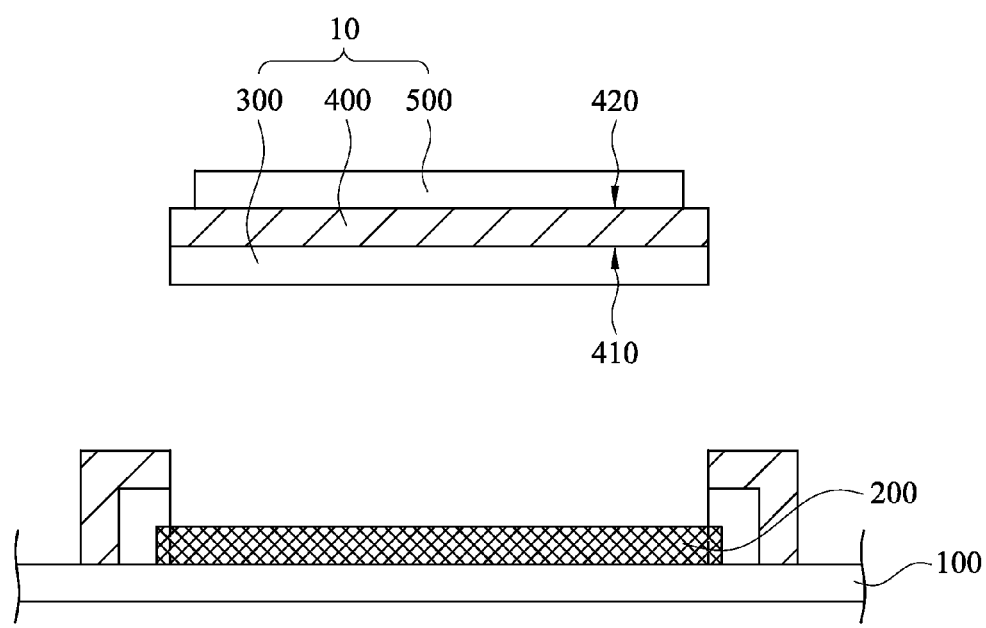

Reference is made to FIG. 7. Substantially, the manufacturer can separate the organic de-bonding layer 200 and the inorganic de-bonding layer 300 to peel the stack structure 10 from the organic de-bonding layer 200. In greater detail, there are different attractive forces respectively between the supporting plate 100 and the organic de-bonding layer 200, between the organic de-bonding layer 200 and the inorganic de-bonding layer 300, and between the inorganic de-bonding layer 300 and the flexible substrate 400. The attractive forces makes the layers mentioned above stack together. Since the attractive force between the organic de-bonding layer 200 and the inorganic de-bonding layer 300 is smaller than the attractive forces between the supporting plate 100 and the organic de-bonding layer 200, and between the inorganic de-bonding layer 300 and the flexible substrate 400, a separation of the organic de-bonding layer 200 and the inorganic de-bonding layer 300 occurs first when the manufacturer peels the structure disposed on the supporting plate 100, thereby leading to a peeling of the stack structure 10 from the supporting plate 100. Moreover, the organic de-bonding layer 200 is still adhered on the supporting plate 100 after the peeling process. The cutting traces of the organic de-bonding layer 200 formed in the cutting treatment are represented by dashed lines in FIG. 7.

Due to the weak attractive force between the organic de-bonding layer 200 and the inorganic de-bonding layer 300, the manufacturer can do the peeling process without exerting his or her strength. Consequently, with the manufacturing method in this embodiment, damages of the active device array 500 above the inorganic de-bonding layer 300 can be prevented during the peeling process.

After the manufacture of FIG. 7, the active device substrate, i.e., the stack structure 10, includes the inorganic de-bonding layer 300, the flexible substrate 400, and the active device array 500. The flexible substrate 400 has a first surface 410 and a second surface 420 opposite to the first surface 410, where the first surface 410 is a flat surface. The inorganic de-bonding layer 300 completely covers the first surface 410 of the flexible substrate 400, and the active device array 500 is disposed above the second surface 420 of the flexible substrate 400.

In this embodiment, the material of the inorganic de-bonding layer 300 can be metal, metal oxide, or a combination thereof. Since the attractive force between the organic de-bonding layer 200 and the inorganic de-bonding layer 300 of the active device substrate is weak due to their significant material difference, the manufacturer can separate them easily after performing the manufacture.

In greater detail, in one or more embodiments, the material of the inorganic de-bonding layer 300 can be metal, such as Au, Ag, Pt, Cu, Ti, Al, Cr, Pd, Rh, Mo, W, Zn, Sn, or a combination thereof. The attractive forces between atoms in the inorganic de-bonding layer 300 are provided by metallic bonds, while the attractive forces between atoms in the organic de-bonding layer 200 are mainly Van der Waals' forces. These two type forces makes the attractive force between the inorganic de-bonding layer 300 and the organic de-bonding layer 200 be weak, such that the manufacturer can separate them easily after performing the manufacture. The thickness of the inorganic de-bonding layer 300 may be about 0.001 to 1 μm if the material of the inorganic de-bonding layer 300 is metal. Moreover, the inorganic de-bonding layer 300 is transparent if the thickness of the inorganic de-bonding layer 300 is about 0.001 to 0.02 μm.

In one or more embodiments, the material of the inorganic de-bonding layer 300 can be metal oxide, such as $In_2O_3$, $SnO_2$, ZnO, CdO, TiN, $In_2O_3$:Sn (ITO), ZnO:In (IZO), ZnO:Ga (GZO), ZnO:Al (AZO), $SnO_2$:F, $TiO_2$:Ta, $CdIn_2O_4$, $Cd_2SnO_4$, $Zn_2SnO_4$, or a combination thereof. The thickness of the inorganic de-bonding layer 300 may be about 0.001 to 1 μm if the material of the inorganic de-bonding layer 300 is metal oxide.

Figure 8:
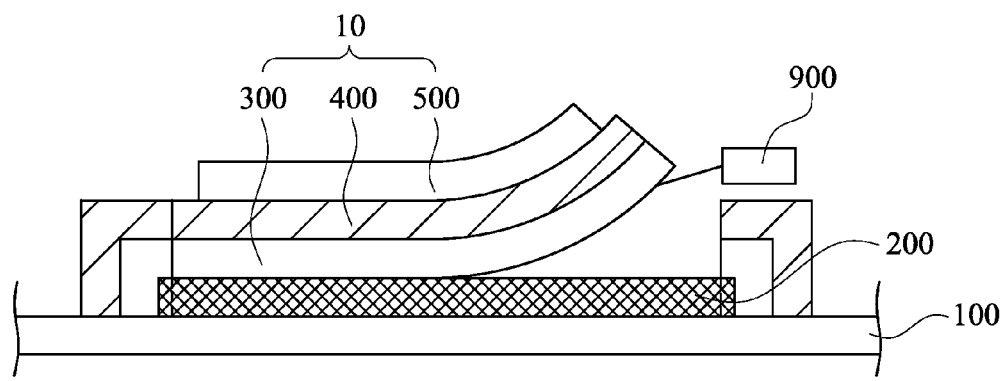
FIG. 8 shows the stack structure is peeled from the organic de-bonding layer.

Since the material of the inorganic de-bonding layer 300 is metal or metal oxide, the electrostatic charge aggregation below the stack structure 10 produced upon peeling can be avoided, and the active device array 500 on the flexible substrate 400 will not be damaged by charge. In greater detail, reference is made to FIG. 8 which is an electrostatic test figure of the stack structure 10, the organic de-bonding layer 200, and the supporting plate 100 of FIG. 6 when the stack structure 10 is peeling from the organic de-bonding layer 200. In this example, the supporting plate 100 was made of glass, the organic de-bonding layer 200 was made of FAS, the inorganic de-bonding layer 300 was made of metal, and the flexible substrate 400 was made of polyimide. The electrostatic test using an electrostatic meter 900 was processing when the stack structure 10 was peeled from the organic de-bonding layer 200. An electrostatic voltage below the inorganic de-bonding layer 300 was undetectable, which indicated the electrostatic voltage was too small during the peeling process. In contrast, an electrostatic voltage measured in a situation that the flexible substrate (made of polyamide) was directly peeled from the supporting plate (made of glass) was about −0.8 kV, which meant the electrostatic charge aggregation might be too strong to damage the active device array disposed on or above the flexible substrate during the peeling process.

Figure 9:
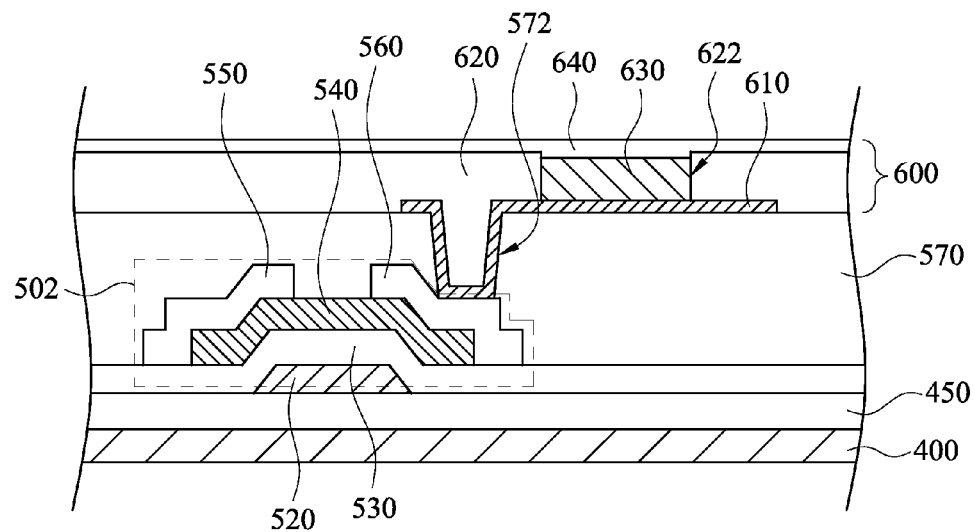
FIG. 9 is a cross-sectional view of a display device according to one embodiment of the present invention.

The following paragraphs provide detailed explanations with respect to the manufacturing method of a display device in this embodiment. FIG. 9 is a cross-sectional view of the display device according to one embodiment of the present invention. In this embodiment, the active device 502 is a bottom gate thin film transistor. The active device 502 includes a gate electrode 520, a gate insulator layer 530, a channel layer 540, a source electrode 550, and a drain electrode 560. The gate electrode 520 is disposed above the flexible substrate 400. The channel layer 540 is disposed above the gate electrode 520. The gate insulator layer 530 is disposed between the channel layer 540 and the gate electrode 520. The source electrode 550 and the drain electrode 560 are disposed on the channel layer 540, and are electrically connected to the channel layer 540, respectively.

In greater detail, the material of the gate 520 can include Ti, Mo, Cr, Ir, Al, Cu, Ag, Au, Zn, In, Ga, a combination thereof, or an alloy thereof. For example, the manufacturer can form a first conductive layer first, and then pattern the first conductive layer to form the gate electrode 520 above the flexible substrate 400. The first conductive layer can be formed by PVD such as sputtering, or CVD, and the method of patterning the first conductive layer can be lithography and etching, screen printing, ink-jet printing, or laser ablation.

The material of the gate insulator layer 530 can include silicon nitride, silicon oxide, silicon oxynitride, or a combination thereof. The gate insulator layer 530 can be formed by CVD.

The material of the channel layer 540 can include amorphous silicon, polycrystalline silicon, microcrystalline silicon, monocrystalline silicon, organic semiconductor, oxide semiconductor, or a combination thereof. For example, the manufacturer can form a semiconductor layer first, and then patterning the semiconductor layer to form the channel layer 540 on the gate insulator layer 530. The semiconductor layer can be formed by PVD such as sputtering, or CVD, and the first conductive layer can be patterned by lithography and etching, screen printing, ink-jet printing, or laser ablation.

The material of the source electrode 550 and the drain electrode 560 can include Ti, Mo, Cr, Ir, Al, Cu, Ag, Au, Zn, In, Ga, a combination thereof, or an alloy thereof. For example, the manufacturer can form a second conductive layer first to cover the channel layer 540 and the gate insulator layer 530. Substantially, the manufacturer can pattern the second conductive layer to form the source electrode 550 and the drain electrode 560 respectively disposed at two sides of the channel layer 540. The forming method of the second conductive layer can be conducted by PVD such as sputtering, or CVD, and the patterning method of the first conductive layer can be conducted by lithography and etching.

In one or more embodiments, a buffer layer 450 can be disposed between the flexible substrate 400 and the active device 502. The buffer layer 450 can completely cover the flexible substrate 400 to prevent the damages of the flexible substrate 400. The material of the buffer layer 450 can be silicon nitride, and the buffer layer 450 can be formed by PVD such as sputtering, or CVD.

Moreover, the active device 502 can further include a passivation layer 570 to cover the gate insulator layer 530, the channel layer 540, the source electrode 550, and the drain electrode 560. The passivation layer 570 can have a via hole 572 to expose the drain electrode 560 of the active device 502, such that the active device 502 can be electrically connected to other elements through the via hole 572. In this embodiment, the material of the passivation layer 570 can include silicon nitride, silicon oxide, silicon oxynitride, or a combination thereof. The passivation layer 570 can be formed by spin coating, and the via hole 572 can be formed by lithography and etching.

The active device 502 can be a switch for the pixel unit of the display device. For a liquid crystal display device, the drain electrode 560 of the active device 502 can be electrically connected to a pixel electrode. For an electroluminescence display device, the drain electrode 560 of the active device 502 can be electrically connected to an electrode of an electroluminescence element, such as a light emitting diode or an organic light emitting diode, to provide a driving voltage to the electroluminescence element. For an electrowetting display device, the drain electrode 560 of the active element 502 can be electrically connected to a pixel electrode to change the position of polar molecules therein. For an electrophoresis display device, the drain electrode 560 of the active device 502 can be electrically connected to a pixel electrode to change the positions of color particles in microencapsulations therein.

As such, for convenience, the manufacturer can choose to fabricate a display element 600 after fabricating the active element 502. The display element 600 includes a first electrode 610, a pixel define layer 620, a luminous layer 630, and a second electrode 640. The first electrode 610 is disposed above the active device 502, and is electrically connected to the drain electrode 560 of the active element 502. The pixel define layer 620 covers the first electrode 610 and the active device 502. The pixel define layer 620 has a pixel opening 622 to expose a portion of the first electrode 610. The luminous layer 630 is disposed on the first electrode 610 and in the pixel opening 622. The second electrode 640 covers the luminous layer 630.

In greater detail, the material of the first electrode 610 can include indium tin oxide, indium zinc oxide, aluminum zinc oxide, or a combination thereof. For example, the manufacturer can form a third conductive layer on the active device 502 to cover the active device 502 completely. Substantially, the manufacturer can pattern the third conductive layer to form the first electrode 610. In this embodiment, the third conductive layer can be formed by PVD such as sputtering, or CVD, and the third conductive layer can be patterned by lithography and etching.

In this embodiment, the material of the pixel define layer 620 can include organic material, inorganic material, or a combination thereof. The pixel define layer 620 can be formed by spin coating, and the pixel opening 622 can be formed by lithography and etching.

In one or more embodiments, from a terminal of the luminous layer 630 adjacent to the first electrode 610, the structure of the luminous layer 630 includes a hole transport layer, an organic light emitting layer, and a electron transport layer in sequence. However, the scope of the claimed invention should not be limited in this respect.

The material of the second electrode 640 can include indium tin oxide, indium zinc oxide, aluminum zinc oxide, or a combination thereof. The second electrode 640 can be formed by PVD such as sputtering, or CVD.

Figure 10:
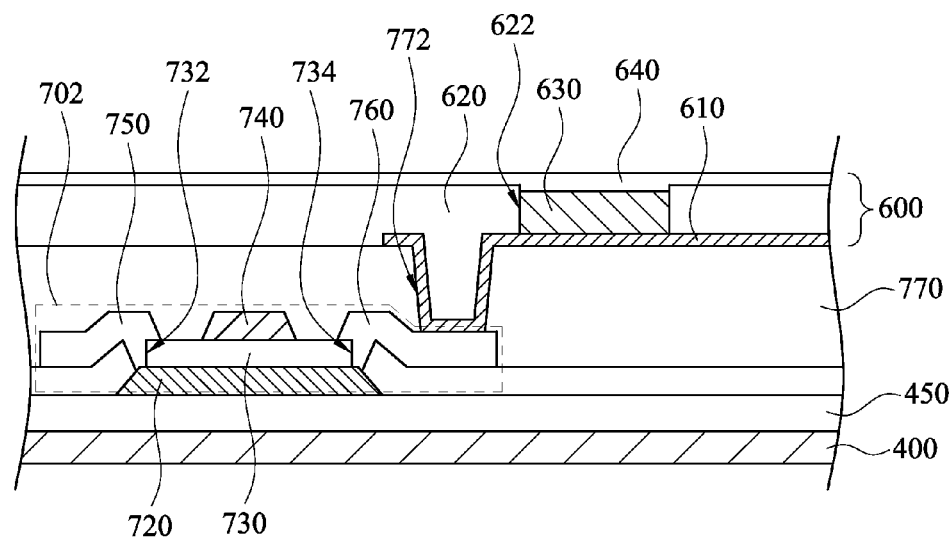
FIG. 10 is a cross-sectional view of the display device according to another embodiment of the present invention.

The active device 502 mentioned above should not limit the scope of the claimed invention. In one or more embodiments, the active device can be a top gate thin film transistor. FIG. 10 is a cross-sectional view of the display device according to another embodiment of the present invention. An active device 702 includes a channel layer 720, a gate insulator layer 730, a gate electrode 740, a source electrode 750, and a drain electrode 760. The channel layer 720 is disposed above the flexible substrate 400. The gate insulator layer 730 covers the channel layer 720. The gate insulator layer 730 has a first opening 732 and a second opening 734 to respectively expose portions of the channel layer 720. The gate electrode 740 is disposed on the gate insulator layer 730, such that the gate insulator layer 730 is disposed between the channel layer 720 and the gate electrode 740. The source electrode 750 and the drain electrode 760 are both disposed on the gate insulator layer 730, and they are electrically connected to the channel layer 720 through the first opening 732 and the second opening 734, respectively.

The active device 702 can be a switch for the pixel unit of the display device. As such, the manufacturer can choose to fabricate a display element 600 after fabricating the active element 702. Other relevant structural details of the present embodiment are all the same as the embodiment shown in FIG. 9, and, therefore, a description in this regard will not be repeated hereinafter.

In one or more embodiments, the cutting treatment can be performed after fabricating the display element 600. In greater detail, the manufacturer can fabricate the active device 502 or 702 and the display element 600 of FIG. 9 or FIG. 10 above the flexible substrate 400 in sequence after performing the manufacture of FIG. 4. As shown in FIG. 6, the cutting treatment including cutting the flexible substrate 400 and the inorganic de-bonding layer 300 to define the edges of the stack structure 10 can be performed after fabricating the display element 600. As such, in this embodiment, the stack structure 10 includes the inorganic de-bonding layer 300, the flexible substrate 400, the active device 502 (or 702), and the display element 600. Thus, the stack structure 10 can be peeled from the supporting plate 100 by separating the inorganic de-bonding layer 300 and the organic de-bonding layer 200 to finish the manufacture of the display device.

However, in other embodiments, the cutting treatment can be performed after fabricating the active device substrate and before fabricating the display element 600 (see FIG. 9 and FIG. 10). In greater detail, the manufacturer can fabricate the active device 502 of FIG. 9 or 702 of FIG. 10 above the flexible substrate 400 after performing the manufacture of FIG. 4. Substantially, the manufacturer can perform the cutting treatment as shown in FIG. 6, and then form the display element 600 on the active device 502 or 702. Thus, the manufacture of forming the display device is complete after separating the inorganic de-bonding layer 300 and the organic de-bonding layer 200.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A manufacturing method of an active device substrate, comprising:
   providing a supporting plate;
   forming an organic de-bonding layer on the supporting plate;
   forming an inorganic de-bonding layer on the organic de-bonding layer, wherein the material of the inorganic de-bonding layer is metal, metal oxide, or a combination thereof;
   forming a flexible substrate on the inorganic de-bonding layer, wherein a surface of the flexible substrate adjacent to the inorganic de-bonding layer is a flat surface;
   forming at least one active device on or above the flexible substrate;
   cutting the flexible substrate and the inorganic de-bonding layer to form a stack structure which is formed by the inorganic de-bonding layer, the flexible substrate and the active device; and
   separating the organic de-bonding layer and the inorganic de-bonding layer.

2. The manufacturing method of claim 1, further comprising:
   cutting the organic de-bonding layer.

3. The manufacturing method of claim 1, wherein the step of forming the organic de-bonding layer is performed by physical vapor deposition (PVD), chemical vapor deposition (CVD), spin coating, spray coating, plasma modification, or printing, wherein the material of the organic de-bonding layer is parylene, silane, siloxane, organofluorine, FAS, or a combination thereof, wherein the step of forming the inorganic de-bonding layer is performed by PVD, CVD, or sputtering, and the manufacturing method further comprises:

thermal annealing the organic de-bonding layer before forming the inorganic de-bonding layer.

4. A manufacturing method of a display device, comprising:

the manufacturing method of an active device substrate of claim 1; and forming at least one display element on the at least one active device.

5. The manufacturing method of claim 4, wherein the flexible substrate and the inorganic de-bonding layer are cut to separate the organic de-bonding layer and the inorganic de-bonding layer before the step of forming the at least one display element on the at least one active device.

6. The manufacturing method of claim 4, wherein the flexible substrate and the inorganic de-bonding layer are cut to separate the organic de-bonding layer and the inorganic de-bonding layer after the step of forming the at least one display element on the at least one active device.

* * * * *